United States Patent
Kobayashi et al.

(10) Patent No.: US 7,400,863 B2
(45) Date of Patent: Jul. 15, 2008

(54) SWITCH APPARATUS, SWITCHABLE POWER AMPLIFICATION APPARATUS, AND MOBILE COMMUNICATION TERMINAL APPARATUS USING THE SAME

(75) Inventors: Tomoo Kobayashi, Tokyo (JP); Shigeo Kusunoki, Kanagawa (JP); Masayuki Shimada, Kanagawa (JP); Toshiyuki Koimori, Kanagawa (JP)

(73) Assignees: Sony Ericsson Mobile Communications Japan, Inc., Tokyo (JP); Sony Corporation, Tokyo (JP)

( * ) Notice: Subject to any disclaimer, the term of this patent is extended or adjusted under 35 U.S.C. 154(b) by 446 days.

(21) Appl. No.: 11/056,266

(22) Filed: Feb. 14, 2005

(65) Prior Publication Data
US 2005/0186919 A1    Aug. 25, 2005

(30) Foreign Application Priority Data
Feb. 19, 2004    (JP)    ............................ 2004-043588

(51) Int. Cl.
H04B 1/44    (2006.01)
H04B 1/38    (2006.01)
(52) U.S. Cl. ............................ 455/78; 455/73; 455/83
(58) Field of Classification Search ............... 455/78, 455/80, 82, 552.1, 73, 83, 168.1, 560, 550.1, 455/188.1
See application file for complete search history.

(56) References Cited

U.S. PATENT DOCUMENTS

| | | | |
|---|---|---|---|
| 5,272,457 A | 12/1993 | Heckaman et al. | |
| 5,661,434 A | 8/1997 | Brozovich et al. | |
| 5,883,541 A | 3/1999 | Tahara et al. | |
| 6,066,993 A * | 5/2000 | Yamamoto et al. | 333/103 |
| 6,118,989 A | 9/2000 | Abe et al. | |
| 6,970,718 B2 * | 11/2005 | Iida | 455/553.1 |
| 6,996,376 B2 * | 2/2006 | Clifton | 455/78 |
| 6,999,786 B2 * | 2/2006 | Iida | 455/550.1 |

(Continued)

FOREIGN PATENT DOCUMENTS

JP    6-334506    12/1994

(Continued)

OTHER PUBLICATIONS

Patent Abstracts of Japan, JP 09-284170, Oct. 31, 1997.

(Continued)

*Primary Examiner*—Sonny Trinh
(74) *Attorney, Agent, or Firm*—Oblon, Spivak, McClelland, Maier & Neustadt, P.C.

(57) ABSTRACT

A switch apparatus of the invention comprises a first input terminal, a second input terminal to which a second input signal having a level lower than a level of the first input signal is supplied, a first switch block for outputting the first input signal supplied from the first input terminal through a plurality of switching elements, a second switch block for outputting the second input signal supplied from the second input terminal through a plurality of switching elements; and a control terminal to which a control signal is supplied wherein the control signal controls the first switch block when outputting the first input signal, and controls the second switch block when outputting the second input signal, wherein the first switch block is configured to have a smaller number of switching elements than that of the second switch block.

19 Claims, 10 Drawing Sheets

U.S. PATENT DOCUMENTS

| | | | |
|---|---|---|---|
| 7,043,208 B2 * | 5/2006 | Nigra | 455/78 |
| 7,113,752 B2 * | 9/2006 | Leinonen et al. | 455/78 |
| 7,142,824 B2 * | 11/2006 | Kojima et al. | 455/78 |
| 2003/0181167 A1 * | 9/2003 | Iida | 455/78 |
| 2004/0224643 A1 * | 11/2004 | Nakai | 455/78 |
| 2005/0101263 A1 * | 5/2005 | Kim | 455/78 |
| 2005/0159112 A1 * | 7/2005 | Iida | 455/78 |

FOREIGN PATENT DOCUMENTS

| | | |
|---|---|---|
| JP | 8-023270 | 1/1996 |
| JP | 9-321829 | 12/1997 |
| JP | 10-150362 | 6/1998 |
| JP | 2000-208754 | 7/2000 |
| JP | 2001-111450 | 4/2001 |
| JP | 2001217653 | 8/2001 |
| JP | 2004-7796 | 1/2004 |

OTHER PUBLICATIONS

Patent Abstracts of Japan, JP 10-032441, Feb. 3, 1998.

* cited by examiner

SWITCH APPARATUS, SWITCHABLE POWER AMPLIFICATION APPARATUS, AND MOBILE COMMUNICATION TERMINAL APPARATUS USING THE SAME

CROSS REFERENCE TO RELATED APPLICATION

This application claims priority from Japanese Priority Document No. 2004-043588, filed on Feb. 19, 2004 with the Japanese Patent Office, which document is hereby incorporated by reference.

BACKGROUND OF THE INVENTION

1. Field of the Invention

The present invention relates to a switch apparatus, a switchable power amplification apparatus which are suitable for application to a mobile telephone, a PHS phone (Personal Handyphone System), a PDA apparatus (Personal Digital Assistant) provided with a communication function, and a terminal apparatus such as a note-type personal computer using a communication function, and a mobile communication terminal apparatus.

2. Description of Related Art

Now, in Japan, the number of subscribers using mobile phones has exceeded 70% of the population, and approximately 40% of them are owners of mobile communication terminal apparatus which uses a CDMA (Code Division Multiple Access) technology. In the future, when the demand for these terminals is replaced from PDC (Personal Digital Cellular) terminal apparatus and the like by a mobile communication terminal system based on a W-CDMA (Wideband-CDMA) method, the demand for the mobile communication terminal system is anticipated to grow further.

In a mobile radio communication system using the PDC, CDMA methods or the like, such communication is secured between a mobile terminal and a base station by establishing a radio channel therebetween. However, because of a changing communication distance from the base station or due to fading in a transmission path, a signal level will change from time to time. Therefore, in a transmission system of the mobile terminal, it is arranged such that after adjusting a transmission signal to a desired signal level in a power amplifier, the signal is transmitted to the base station.

Conventionally, it has been attempted to improve an efficiency of its operation by use of a DC-DC converter in a power supply of the power amplifier in the transmission system. However, because the DC-DC converter generates a noise, and in addition, large capacity coils are required, there are many problems still to be solved.

Here, in a patent document 1 (Japanese Laid-Open Patent H9-284170), on the premise for use of an antenna duplexer, an antenna switch is disclosed which has improved a distortion characteristic of the switch by use of a grounded-gate FET as a switching element on the side of the transmitter.

Patent Document 1: Japanese Laid-Open Patent No. H9-284170.

However, according to the antenna switch disclosed in this patent document 1, because of an insufficient isolation on the side of its transmitter, there occurs a problem that a power leakage or invasion from its receiver side to its transmitter side cannot be prevented adequately, thereby making it unsuitable to be applied to handling bidirectional signals.

In the case of a switching device for outputting a plurality of signals by selectively switching therebetween, there occurs a problem that an output of one line invades another line. If this phenomenon takes place, because that an output from one line is shunted to pass to its output terminal as well as to another line, there occurs a loss in the output thereof.

A recent mobile phone is added with many functions of a so-called application such as a present location detection function with a GPS (Global Positioning System) sensor, a TV signal receiving function, an infrared communication function, a TV telephone function with a camera and the like. Therefore, an occasion of performing a high speed communication with the base station is increasing, and also a period of time for performing this high speed communication is prolonging. Thereby, an average transmission power is increasing to more than 10 mW, and thus it is required more and more to enable to deliver a transmission power which is amplified to a large power without causing any loss.

The present invention has been contemplated in consideration of the above-mentioned problems, and is configured to provide a switch apparatus, a switchable power amplification apparatus and a mobile communication terminal apparatus which are capable of preventing the occurrence of a problem of an output intrusion from one line to another line, when selectively outputting a signal from a plurality of lines, so as to be able to output the signal without a loss.

SUMMARY OF THE INVENTION

Means for solving the above-mentioned problems according to an aspect of one embodiment of the present invention is comprised of a first input terminal through which a first input signal is supplied, a second input terminal through which a second input signal which is lower than a level of the first input signal is supplied, a first branch switch block to which the first input signal is supplied through the first input terminal for outputting the same through a plurality of switching elements therefrom, a second branch switch block to which the second input signal which is lower than the level of the first input signal is supplied through the second input terminal for outputting the same through a plurality of switching elements therefrom, and a control terminal through which a control signal is supplied for controlling such that when outputting the first input signal, the first branch switch block is activated, and when outputting the second input signal, the second branch switch block is activated, wherein the first branch switch block is constructed using a smaller number of switching elements than that of the second branch switch block.

According to the present invention, by arranging for the first branch switch block to be constructed with the smaller number of switching elements than that in the second branch switch block, isolation of the second branch switch block is ensured to become higher than isolation of the first branch switch block.

Thereby, when producing an output from the first branch switch block, it is enabled to prevent a problem that this output intrudes into the second branch switch block, thereby enabling to yield the output from the first branch switch block without causing a loss.

According to the present invention, when selectively outputting a signal from a plurality of lines, it is enabled to output the signal without causing a loss advantageously by preventing the problem that an output from any one line invades another line.

DESCRIPTION OF THE PREFERRED EMBODIMENTS

Figure 1:
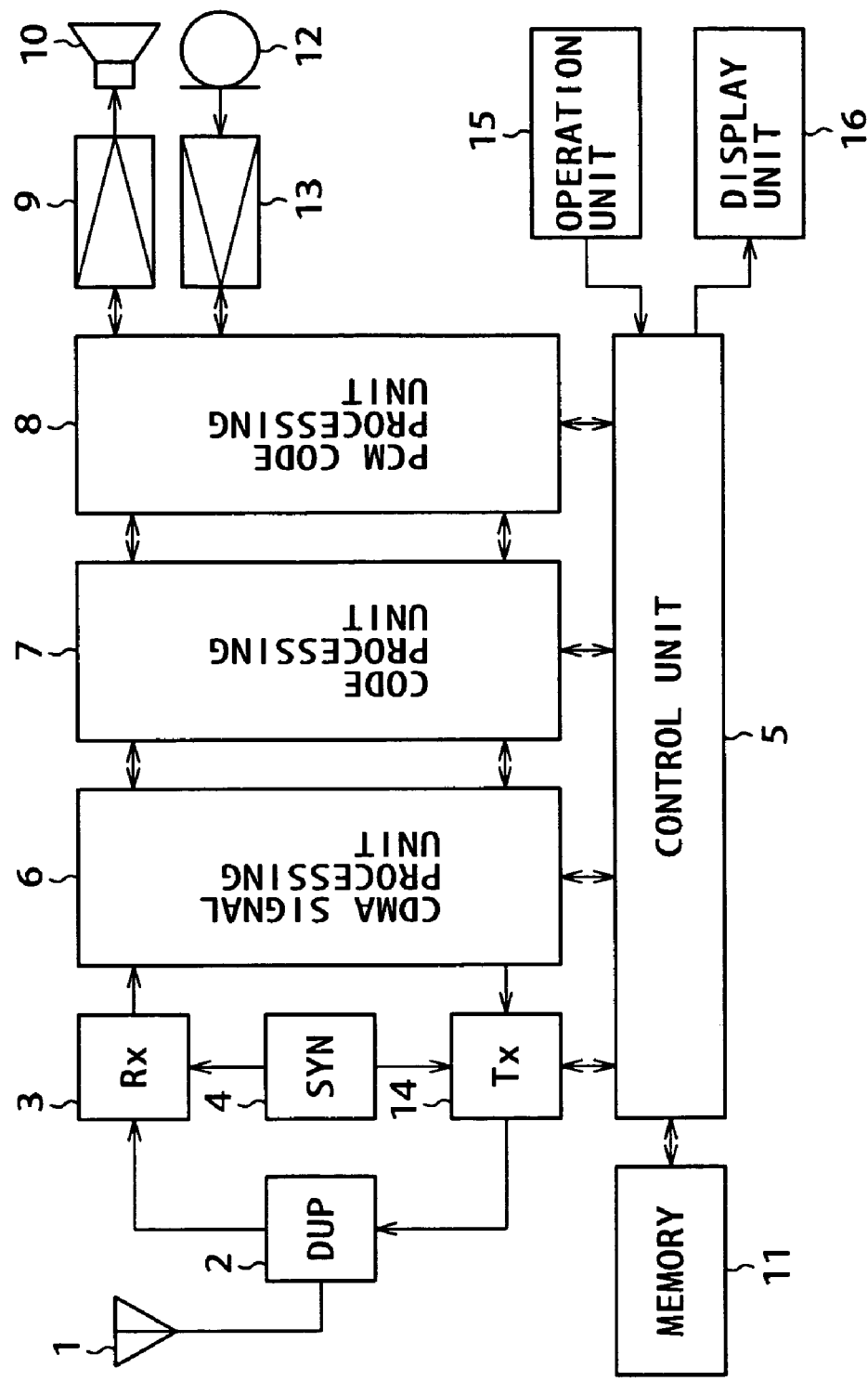
FIG. 1 is a block diagram of a mobile phone according to a first embodiment of the present invention.

The present invention is applicable to a mobile phone based on a W-CDMA (Wideband-Code Division Multiple Access) format as shown in FIG. 1.

First Preferred Embodiment (Overall Configuration and Operation of Mobile Phone)

A mobile phone according to a first preferred embodiment of the present invention receives a radio frequency signal transmitted from a base station through an antenna 1 at the time of its receiving. The radio frequency signal received through this antenna 1 is supplied to a receiver circuit 3 (RX) through an antenna duplexer (DUP) 2.

The receiver circuit 3 converts a radio frequency signal to an intermediate frequency signal by mixing a receiver local oscillation signal supplied from a frequency synthesizer (SYN) 4 with the radio frequency signal received through the antenna 1, and supplies it to a CDMA signal processing unit 6. By way of example, a frequency of the receiver local oscillation signal outputted from the frequency synthesizer 4 is controlled in response to a control signal from the control unit 5.

The CDMA signal processing unit 6 applies an orthogonal demodulation processing to the received intermediate frequency signal as well as a de-spreading processing thereto using a spread code (PN code) assigned to a reception channel so as to convert the received intermediate frequency signal to a received data in a predetermined format corresponding to its data rate then to be supplied to a code processing unit 7. By way of example, the CDMA signal processing unit 6 supplies information indicating a data rate of the received data to the control unit 5 as a received data rate.

The code processing unit 7, after applying a compression/decompression processing to the received data supplied from the CDMA signal processing unit 6 on the basis of a received data rate notified from the control unit 5, carries out a demodulation processing and an error correction demodulation processing using a Viterbi decoder or the like to reproduce the received data in a base band.

A PCM code processing unit 8 carries out a different signal processing depending on a type of communication (a voice communication or data communication) discriminated in the control unit 5.

More specifically, at the time of voice communication, the PCM code processing unit 8 applies a PCM demodulation processing to the received data supplied from the code processing unit 7 to output a received analogue signal therefrom. This received analogue voice signal is amplified in a received voice signal amplifier 9, and is annunciated through speaker 10.

Further, at the time of data communication, the PCM code processing unit 8 supplies a received data supplied from the code processing unit 7 to the control unit 5. The control unit 5 stores this received data in a memory (RAM) 11. And, the memory (RAM) 11 outputs the received data to a PDA (Personal Digital Assistance) or to a note-type personal computer through an external interface which is not shown, as required.

Then, at transmission, a voice of a speaker to be transmitted at the time of a voice communication is collected with a microphone 12, and is amplified in a voice amplifier 13 to an appropriate level. And after subjecting to a PCM coding processing in the PCM code processing unit 8, it is supplied to the code processing unit 7 as a transmission data.

At the time of this voice communication, the code processing unit 7 detects a quantity of energy for an input sound on the basis of the transmission data supplied from the PCM code processing unit 8, and determines a data rate on the basis of a result of the detection. Then, after compressing the transmission data into a burst signal in a format corresponding to the data rate described above, and further applying an error correction code processing thereto, supplies it to the CDMA signal processing unit 6.

Further, a data outputted from a PDA apparatus, a note-type personal computer, or an image data supplied from a digital camera apparatus are supplied to the control unit 5 through an external interface, then from the control unit 5 to the code processing unit 7 through the PCM code processing unit 8. Furthermore, data such as electronic mails (mail with mobile phone) is also supplied to the control unit 5, then from this control unit 5 to the code processing unit 7 through the PCM code processing unit 8.

The code processing unit 7, under the data communication, compresses the transmission data supplied from the PCM code processing unit 8 into a burst signal in a format corresponding to a preset data rate, and after applying an error correction coding processing thereto, supplies it to the CDMA signal processing unit 6.

By the way, the data rates at the times of the voice communication and the data communication are notified to the control unit 5 as a transmission data rate.

The CDMA signal processing unit 6 applies a spread code processing to the burst signal compressed in the code processing unit 7 using a PN code assigned to a transmission channel. Then, after applying an orthogonal modulation processing to the transmission signal which is spread-coded, this orthogonally modulated signal is then supplied to the transmitter circuit 14 (TX).

The transmitter circuit 14 converts the orthogonal modulation signal to a radio frequency signal by mixing it with a transmitter local oscillation signal supplied from the frequency synthesizer 4. Then, the transmitter circuit 14, on the basis of the transmission data rate notified from the control unit 5, and with a power amplification circuit to be described in detail later, amplifies only an effective part of the radio frequency signal to be output as a transmission radio frequency signal. This transmission radio frequency signal outputted from the transmitter circuit 14 is supplied to the antenna 1 through the antenna duplexer 2 for a burst transmission therefrom to the base station.

By the way, a predetermined input operation for inputting characters, codes, or the like is performed by operating the operation unit 15, and characters or images in a mail by mobile phone are displayed on the display unit 16.

(Constitution of a Power Amplification Circuit)

Figure 2:
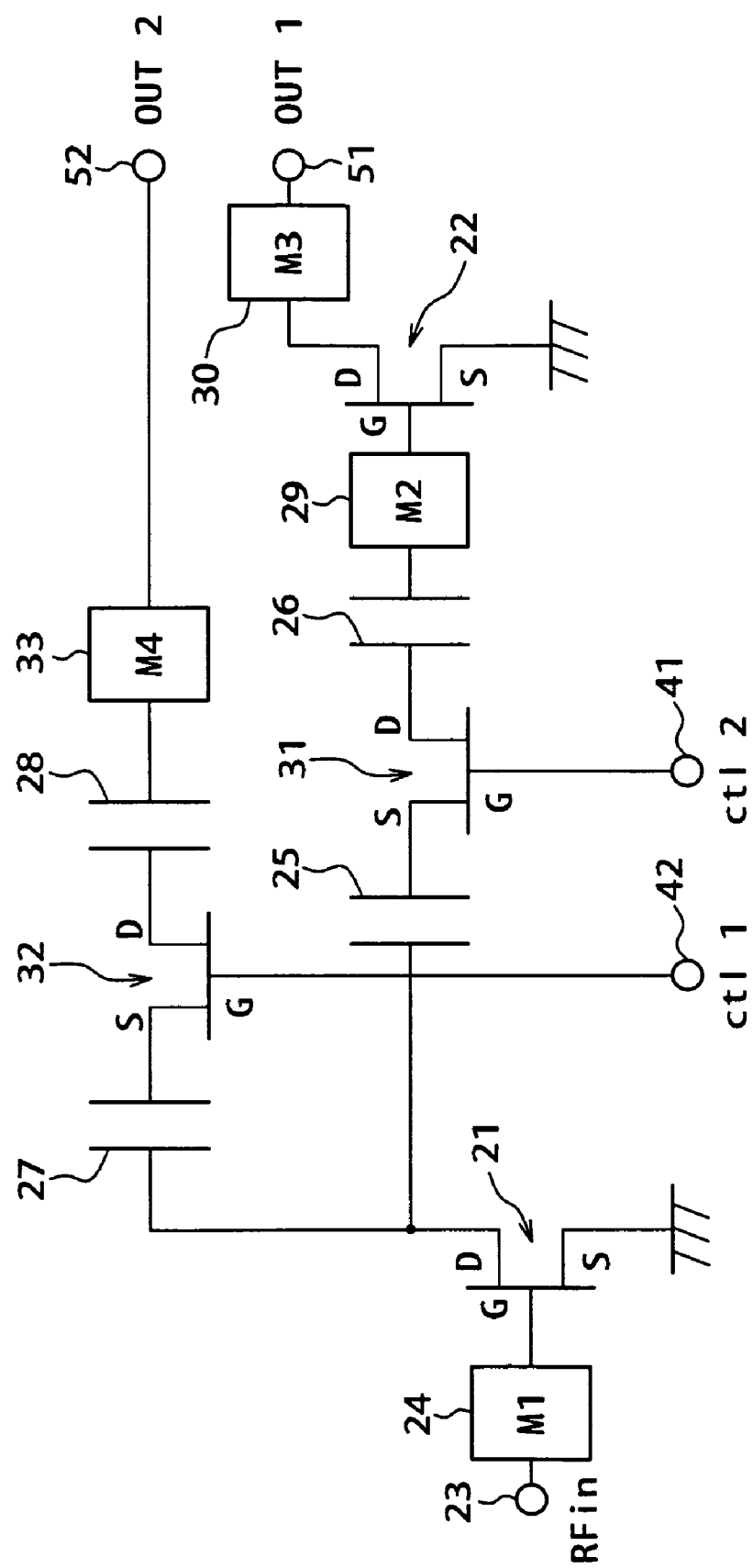
FIG. 2 is a circuitry diagram of a power amplification circuit provided in a transmission circuit of the above mobile phone.

The transmission circuit 14 in the mobile phone according to the embodiment of the present invention is configured to include a power amplification circuit as shown in FIG. 2. This power amplification circuit has two power amplification FETs (Field Effect Transistors) with a first power amplification FET 21 and a second power amplification FET 22, and two power switching FETs with a first switch FET 31 and a second switch FET 32.

More specifically, in this power amplification circuit, a first matching circuit 24 (M1) is connected between a gate (G) of the first amplification FET 21 the source (S) of which is grounded and an input terminal 23 (RFin), and a drain terminal (D) of the first amplification FET 21 is connected through a DC-cut capacitor 25 to a source of the first switching FET 31.

A drain of the first switching FET 31 is connected through a DC-cut capacitor 26 to an input terminal of a second matching circuit 29 (M2), and an output terminal of this second matching circuit 29 is connected to a gate of the second amplification FET 22 the source of which is grounded. A drain of the second amplification FET 22 is connected through a third matching circuit 30 (M3) to a first output terminal 51 (out 1).

Also, the drain terminal (D) of the first amplification FET 21 is connected through a DC-cut capacitor 27 to a source of the second switching FET 32. A drain of the second switching FET 32 is connected through a DC-cut capacitor 28 to an input terminal of a fourth matching circuit 33 (M4), and an output terminal of the fourth matching circuit 33 is connected to a second output terminal 52 (out 2).

And, a gate of the first switching FET 31 is connected to a first control terminal 41 (ctl 1) to which a switching control signal is supplied from the control unit 5 shown in FIG. 1, and a gate of the second switching FET 32 is connected to a second control terminal 42 (ctl 2) to which a switching control signal is supplied from the control unit 5 described above.

(Operation of the Power Amplification Circuit)

This power amplification circuit is arranged selectively to produce a transmission output by switching between a large power transmission output which is amplified in multi stages in the first amplifier FET 21 as well as in the second amplifier FET 22 (for outputting from the first output terminal 51) and an medium power transmission output which is amplified only by the first amplifier FET 21 (for outputting from the second output terminal 52).

More specifically, in this exemplary embodiment, a range of the "medium power" is defined to be approximately from −60 dBm to 20 dBm, and a range of the "large power" is defined to be approximately from 21 dBm to 30 dBm, and when obtaining a large power transmission output, the control unit 5 described above supplies a control signal, for example, of 2.7 V to the first control terminal 41, and a control signal of 0 V to the second control terminal 42. Thereby, the second switching FET 32 to the gate of which the control signal of 0V is supplied is turned OFF, and the first switching FET 31 to the gate of which the control signal of 2.7 V is supplied is turned ON.

And, a transmission signal supplied through the input terminal 23 to the first amplifying FET 21 is amplified therein, and is supplied therefrom through the first switching FET 31 to the second amplifying FET 22 to be further amplified therein, thereby allowing it to be outputted as a large power transmission output, e.g., approximately of 28 dBm from the first output terminal 51.

On the other hand, when producing a medium power transmission output, the control unit 5 supplies a control signal, e.g., of 0V to the first control terminal 41 and a control signal of 2.7 V to the second control terminal 42. Thereby, the first switching FET 31 to the gate of which the control signal of 0 V is supplied is turned OFF, and the second switching FET 32 to the gate of which the control signal of 2.7 V is supplied is turned ON. And, a transmission signal supplied through the input terminal 23 is amplified in the first amplifying FET 21 to be outputted from the second output terminal 52 as a medium power transmission output, for example, of 18 dBm.

By provisions of an output line for outputting a transmission output which is amplified in multi stages in the first amplification FET 21 and the second amplification FET 22 (the line from the first amplification FET 21 to the first output terminal 51) and an output line for outputting a transmission output which is amplified only in the first amplification FET 21 (the line from the first amplification FET 21 to the second output terminal 52), and also by controlling the first switching FET 31 and the second switching FET 32 inserted in connection with these lines selectively to turn ON and OFF, it is enabled to control for the second amplification FET 22 to become OFF-state during a medium power outputting so as to suppress power consumption. Thereby, during the medium power outputting, the power amplification circuit is ensured to be operable efficiently.

By the way, it is stated in the description of this embodiment that an operating efficiency of the power amplification circuit is improved by causing the control unit 5 to apply a voltage (control signal) of 0 V to the gate of the first or the second switching FETs 31, 32 so that the first or the second switching FETs 31, 32 becomes OFF-state, however, it is not limited thereto, and a power supply itself to the first or the second switching FET 31 or 32 may be stopped to make either one of the switching FETs 31 and 32 OFF-state to the same effect.

(On-Chip Power Amplification Circuit)

(Constitution of JP-HEMT)

Here, it is to be noted that this power amplification circuit is provided as a one chip monolithic IC which is integrated on a gallium arsenide chip, which is implemented by using a HEMT (JP-HEMT) having a different structure from that of a conventional HEMT (High Electron Mobility Transistor) for respective FETs 21, 22, 31 and 32 described above.

Figure 3:
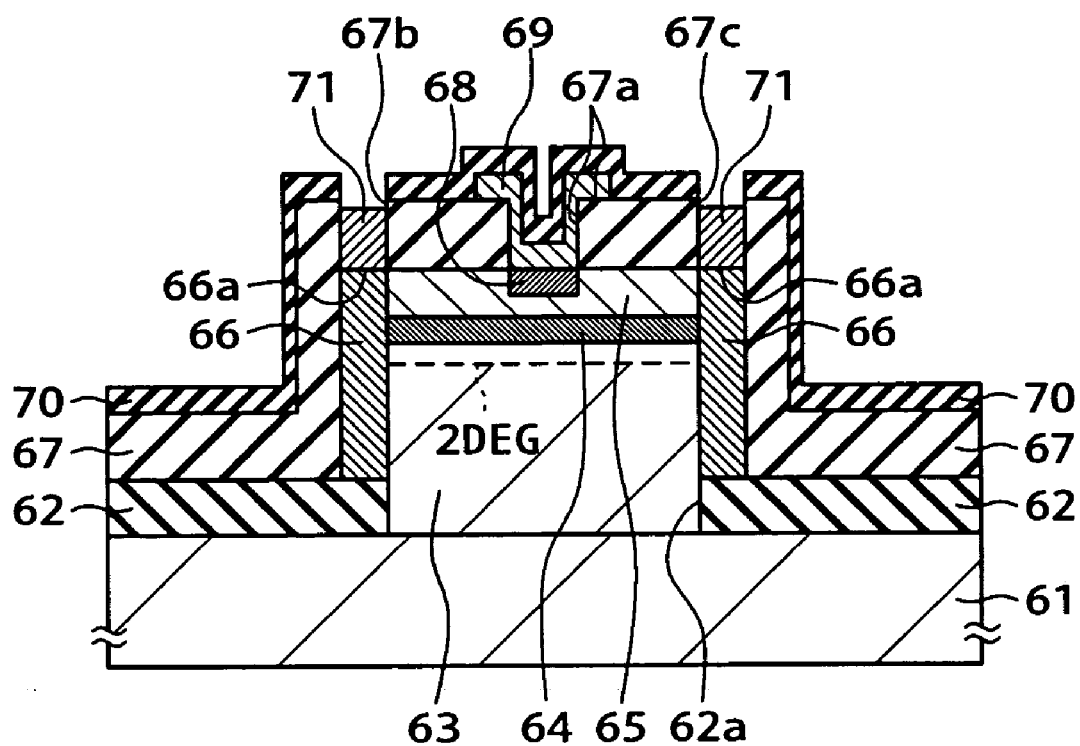
FIG. 3 is a cross-sectional diagram showing arrangements of respective FETs provided in the power amplification circuit.

FIG. 3 shows a cross-sectional view of this JP-HEMT. In the case of this JP-HEMT, a silicon oxide film 62 having an opening section 62*a* is formed on a semi-insulating semiconductor substrate 61.

Further, on a portion of the semiconductor substrate exposed by the opening section 62*a*, there are formed three semiconductor layers, i.e., a channel layer 63, a dope layer 64 and a barrier layer 65, by a selective epitaxial growth method, respectively.

These three semiconductor layers 63 to 65 are formed respectively such that, for example, the channel layer 63 is made of an undoped GaAs, the dope layer 64 is made of a n-type Al$_x$ Ga$_{1-x}$ As doped with Si (x=0.2 to 0.3), and the barrier layer 65 is made of an undoped Al$_x$ Ga$_{1-x}$ As.

Because there exists a difference in electron affinities between the materials of the dope layer 64 and the channel layer 63 as well as a difference in work functions therebetween as the n-type impurity (donor) is introduced into the dope layer 64, there occurs a bend at a discontinuity of energy in an energy band on a hetero junction plane under thermal equilibrium. This is because that electrons resulting from donors on the side of the dope layer 64 move into the channel layer 63 to cause a depletion of donors at an edge in the dope layer 64.

Because the electrons within the channel layer 63 are distributed in a very thin area in two-dimensions, they are referred to as "a two-dimension electron gas (2DEG)", and as a result that they are spatially isolated from the donors, i.e., the originator thereof, they are enabled to move very fast free from the influence of impurity scattering or the like. Hereinafter, this two-dimensional electron gas (2DEG) layer will be referred to as a "high mobility charge channel".

On both sides of the three semiconductor layers 63 to 65 protruding above the silicon oxide film 62, a contact semiconductor layer 66 which is made of GaAs into which a n-type impurity such as Si or the like is introduced is formed, respectively. This contact semiconductor layer 66 is provided for decreasing an ON resistance, and corresponds to a gap layer which is conventionally formed on the barrier layer 65.

The contact semiconductor layer 66, in a sense that it is provided for facilitating a flow of electrons without forming a hetero junction barrier, is preferably made of a same material as that of the channel layer 63. Further, an impurity concentration of the contact semiconductor layer 66 is preferably higher than the dope layer 64 in order to increase its conductivity.

An insulation film 67 made of, for example, silicon nitride is formed to cover the surfaces of the barrier layer 65 and the contact semiconductor layer 66.

A gate opening section 67a is formed in a portion in the silicon nitride film 67 and on the barrier layer 65, and a p-type gate impurity region 68 is formed in a surface area of the barrier layer 65 exposed by this opening section 67a.

Further, from within the gate opening section 67a onto the silicon nitride film 67, a gate electrode 69 made of, for example, Ti/Pt/Au or the like is formed. By a voltage applied to the gate electrode 69, the concentration of the two dimensional electron gas (2DEG) is modulated through the gate impurity region 68. On the gate electrode 69, an insulation film 70 made of, for example, silicon nitride is formed.

In two portions through the silicon nitride films 67, 70 and above the contact semiconductor layer 66, there are formed a source opening section 67b or a drain opening section 67c, and on a surface of the contact semiconductor layer 66 exposed by these opening section 67b, 67c, an ohmic connection layer 71 made of, for example, AuGe/Ni is formed, respectively. At least in a boundary between the ohmic connection layer 71 and the contact semiconductor layer 66 there is formed an alloy region 66a by heating, thereby accomplishing an ohmic contact. On the ohmic connection layer 71, a source electrode or a drain electrode which are not shown are formed, thereby, the JP-HEMT is formed.

In the case of the power amplification circuit described above, an upper layer wiring is formed further on this JP-HEMT through an interlayer insulation film so as to accomplish its on-chip system integration.

(Features and Effect of the JP-HEMT)

In the JP-HEMT having the configuration described above, its operating current (drain current) is supplied mainly to the two dimensional electron gas (2DEG) layer through the drain electrode, ohmic connection layer 71 and the contact semiconductor layer 66. Further, on the side of the source thereof, a drain current mainly from the two dimensional electron gas (2DEG) layer flows into the source electrode through the contact semiconductor layer 66 and the ohmic connection layer 71.

According to this JP-HEMT, because there is interposed no barrier layer 65 having a high resistance in the passage of the drain current, a source resistance and a drain resistance can be reduced, thereby enabling to minimize its ON resistance. Thereby, in comparison with a conventional HEMT, this JP-HEMP features a higher power, faster speed, lower noise and lower power consumption.

Further, because this JP-HEMT has such a configuration that its ohmic connection layer 71 having a limited thickness is not allowed directly to contact with the two dimensional electron gas layer in order to achieve a good ohmic characteristic, it is not necessary to fabricate a plurality of laminated semiconductor layers obliquely to expose an edge portion of the two dimensional electron gas layer by mesa etching or the like.

For a deep etching by mesa etching, some degree of area is required, however, because this JP-HEMT has a structure to place an ohmic contact on the upper end of the contact semiconductor layer 66, an increased area can be made minimum, thereby making it suitable for down-sizing. Therefore, by using the JP-HEMT as the FETs 21, 22, 31 and 32 described above, the power amplification circuit of the invention can be built on one chip.

Further, in the case where this power amplification circuit is constructed using HBTs (Hetero junction Bipolar Transistors) instead of these respective FETs 21, 22, 31 and 32 described above, although the HBT allows use of a plus power supply, it is difficult to build this power amplification circuit on one chip (the power amplification circuit is mounted on multi-chips). Further, in the case where a conventional HEMT is used as FETs 21, 22, 23 and 24, respectively, because the conventional HEMT needs the use a minus power supply, it is necessary specially to provide a minus power supply, and in addition, it becomes difficult to fabricate the power amplification circuit on one chip.

However, by constructing the power amplification circuit using the JP-HEMT as respective FETs 21, 22, 31 and 32 described above, advantageously, it becomes possible to fabricate the power amplification circuit on one chip. Further, in contrast to the conventional HEMT for use on a minus power supply, in the case of this JP-HEMT, it is operable on a plus power source. Therefore, by using this JP-HEMT as respective FETs 21, 22, 31 and 32 described above, a plus power supply from a battery of the mobile phone can be used as it is without the need of forming a minus power source in particular. Therefore, such a particular circuit for forming the minus power source can be omitted, thereby contributing to a compact and light-weight design of the apparatus through a simplified a circuit configuration of the mobile phone.

Effect and Advantage of the First Preferred Embodiment

As clearly understood from the description hereinabove, the mobile phone according to the first embodiment of the present invention has provided, in the power amplification circuit of the transmitter circuit 14, the line for outputting the transmission output which is amplified in multi-stages of the first amplification FET 21 and the second amplification FET 22 (the line from the first amplification FET 21 to the first output terminal 51) and the line for outputting the transmission output which is amplified only by the first amplification FET 21 (the line from the first amplification FET 21 to the second output terminal 52), and by selectively controlling the first switching FET 31 and the second switching FET 32, which are inserted in connection with these lines described above, to turn ON and OFF, it enables to suppress power consumption, for example, by controlling the second amplification FET 22 to be set in OFF state during an medium power output. Thereby, an overall operation efficiency of the power amplification circuit can be improved.

In particular, in the case of a mobile phone based on the W-CDMA method wherein a transmission power changes frequently, it is enabled efficiently to operate the power amplification circuit of the transmitter circuit 14 in response to this frequently changing transmission output, thereby achieving a remarkable effect.

Further, because the JP-HEMT is used as respective FETs 21, 22, 31 and 32 for constituting the power amplification circuit, thereby enabling for each FET 21, 22, 31 and 32 to be fabricated in a microstructure, the power amplification circuit can be formed on one chip.

Still further, because of the use of JP-HEMT which is operable on the plus power source for each FET 21, 22, 31, 32, it becomes possible to utilize the plus power directly from the battery of the mobile phone without the need of specifically forming the minus power source. Thereby, any additional circuit for forming the minus power source can be omitted, contributing to the compact and light-weight design of the apparatus through a simplification of the circuit configuration in the mobile phone.

Second Preferred Embodiment

Next, a mobile phone according to a second preferred embodiment of the present invention will be described. This mobile phone according to the second embodiment features a power regulation unit for regulating an output power of the first amplification FET provided in the power amplification circuit in the transmission circuit 14. By the way, the first embodiment and the second embodiment differ only in this respect. Thereby, in the following, only this difference will be described, omitting duplication of the description.

(Constitution of a Power Regulation Unit)

Figure 4:
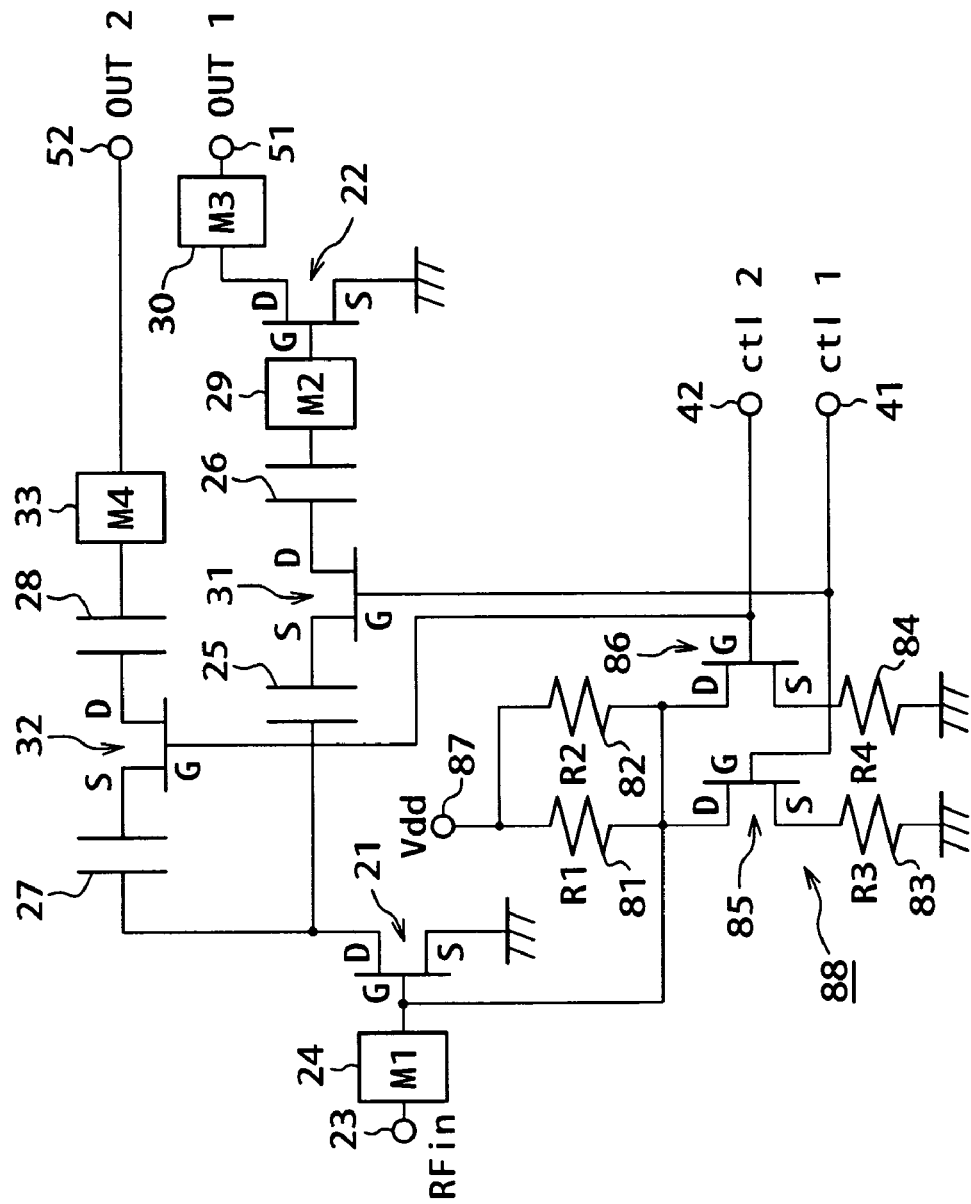
FIG. 4 is a circuitry diagram of a power amplification circuit provided in a transmission circuit in a mobile phone according to a second embodiment of the present invention.

The mobile phone according to the second embodiment has a configuration as shown in FIG.4, wherein a power regulation unit 88 is provided in a power amplification circuit within a transmission circuit 14 for regulating an output level of an medium power output to be outputted through a line from the first amplification FET 21 to the second output terminal 52, by regulating a gate voltage of the first amplification FET 21.

More specifically, this power regulation unit 88 has a first regulation FET 85 the source of which is grounded through a voltage dividing resistor 83 (R3) and likewise a second regulation FET 86 the source of which is grounded through a voltage dividing resistor 84 (R4).

A gate of the first regulation FET 85 is connected to a first control terminal 41 (ctl 1) which is connected to the gate of the first switching FET 31, and a gate of the second regulation FET 86 is connected to a second control terminal 42 (ctl 2) which is connected to the gate of the second switching FET 32.

Further, respective drains of respective regulation FETs 85, 86 are connected through a voltage dividing resistor 81 or a voltage dividing resistor 82 to a reference voltage supply terminal 87 to which a reference voltage (Vdd) is supplied.

And, by connecting the gate of the first amplification FET 21 to a node between the voltage dividing resistor 81 and the drain of the first regulation FET 85 as well as to a node between the voltage dividing resistor 82 and the drain of the second regulation FET 86, the power regulation unit 88 is constructed.

By the way, the first regulation FET 85 and the second regulation FET 86 are also fabricated using the aforementioned JP-HEMT, and this power amplification circuit is also formed on one chip.

(Operation of the Power Regulation Unit)

In this power regulation unit 88, at the time when outputting a large power, the control unit 5 supplies a voltage, for example, of 2.7 V to the first control terminal 41, and a voltage of 0 V to the second control terminal 42. Thereby, the first switching FET 31 is turned ON and the second switching FET 32 is turned OFF as described above, so that a transmission signal supplied through an input terminal 23 is amplified in the first amplification FET 21 and the second amplification FET 22 to a large transmission power, for example, of approximately 28 dBm then to be outputted from the first output terminal 51.

Further, in this case, because that the first control terminal 41 is supplied, for example, with a voltage of 2.7 V, and the second control terminal 42 is supplied with a voltage of 0 V, the first regulation FET 85 in the power regulation unit 88 is turned ON-state, and the second regulation FET 86 therein is turned OFF-state. Thereby, to the gate of the first amplification FET 21 there is to be supplied a voltage with a value obtained by dividing a reference voltage supplied through the reference voltage supply terminal 87 by the voltage dividing resistors 81, 82 and 83.

In contrast, at the time of outputting a medium power, the control unit 5 supplies a voltage, for example, of 2.7 V to the second control terminal 42 and a voltage of 0 V to the first control terminal 41. Thereby, the first switching FET 31 is made OFF and the second switching FET 32 is made ON as described above, causing for a transmission signal supplied through the input terminal 23 to be amplified only in the first amplification FET 21 and outputted through the second output terminal 52.

Further, in this case, because that the second control terminal 42 is supplied a voltage, for example, of 2.7 V and the first control terminal is supplied a voltage of 0 V, the first regulation FET 85 of the power regulation unit 88 is set OFF, and the second regulation FET 86 is set ON. Thereby, to the gate of the first amplification FET 21 there is supplied a voltage with a value obtained by dividing the reference voltage supplied through the reference voltage supply terminal 87 by the voltage dividing resistors 81, 82 and 84.

Here, in this power regulation unit 88, respective values of respective voltage dividing resistors 81 to 84 are set such that there holds a relation "V1<V2" between a value of voltage V1 (=a voltage supplied to the gate of the first amplification FET 21 during outputting a large power) at the time when the reference voltage is divided by the voltage dividing resistors 81, 82, 83, and a value of voltage V2 (=a voltage supplied to the gate of the first amplification FET 21 during outputting a medium power) at the time when the reference voltage is divided by the voltage dividing resistors 81, 82, 84.

Thereby, at the time of outputting an medium power by amplifying the transmission signal only in the first amplification FET 21, by supplying a higher value of voltage to the gate of the first amplification FET 21, it is enabled to improve a value of power of the transmission signal, for example, to approximately 18 dBm during the outputting of this medium power.

Effects and Advantages of the Second Preferred Embodiment

As obviously understandable from the description hereinabove, the mobile phone according to the second embodiment of the invention is provided with the power regulation unit 88 capable of enhancing the value of voltage to be supplied to the gate of the first amplification FET 21 when the transmission signal is to be amplified only in the first amplification FET 21 before outputting as an medium power output, thereby enabling to improve the value of power of the transmission signal during the outputting of the medium power.

Thereby, even if a transmission power required increases very large, it becomes possible to cope with such a situation, and in addition, the same advantages and effects as those by the first embodiment can be obtained.

Third Preferred Embodiment

In the next, a mobile phone according to a third preferred embodiment of the present invention will be described. The mobile phone according to the third embodiment features a phase adjusting circuit provided in the power amplification circuit of the transmitter circuit 14 for canceling a phase difference between a transmission signal to be outputted through the first output terminal 51 and a transmission signal to be outputted through the second output terminal 52.

By the way, the apparatus of the third embodiment differs from the preceding embodiments described above only in this respect. Therefore, only this difference will be described in the following description, omitting duplication of description.

Further, in the following description, an example of this phase adjusting circuit which is provided in the power amplification circuit of the mobile phone according to the first embodiment will be described.

Constitution of the Third Embodiment

Figure 5:
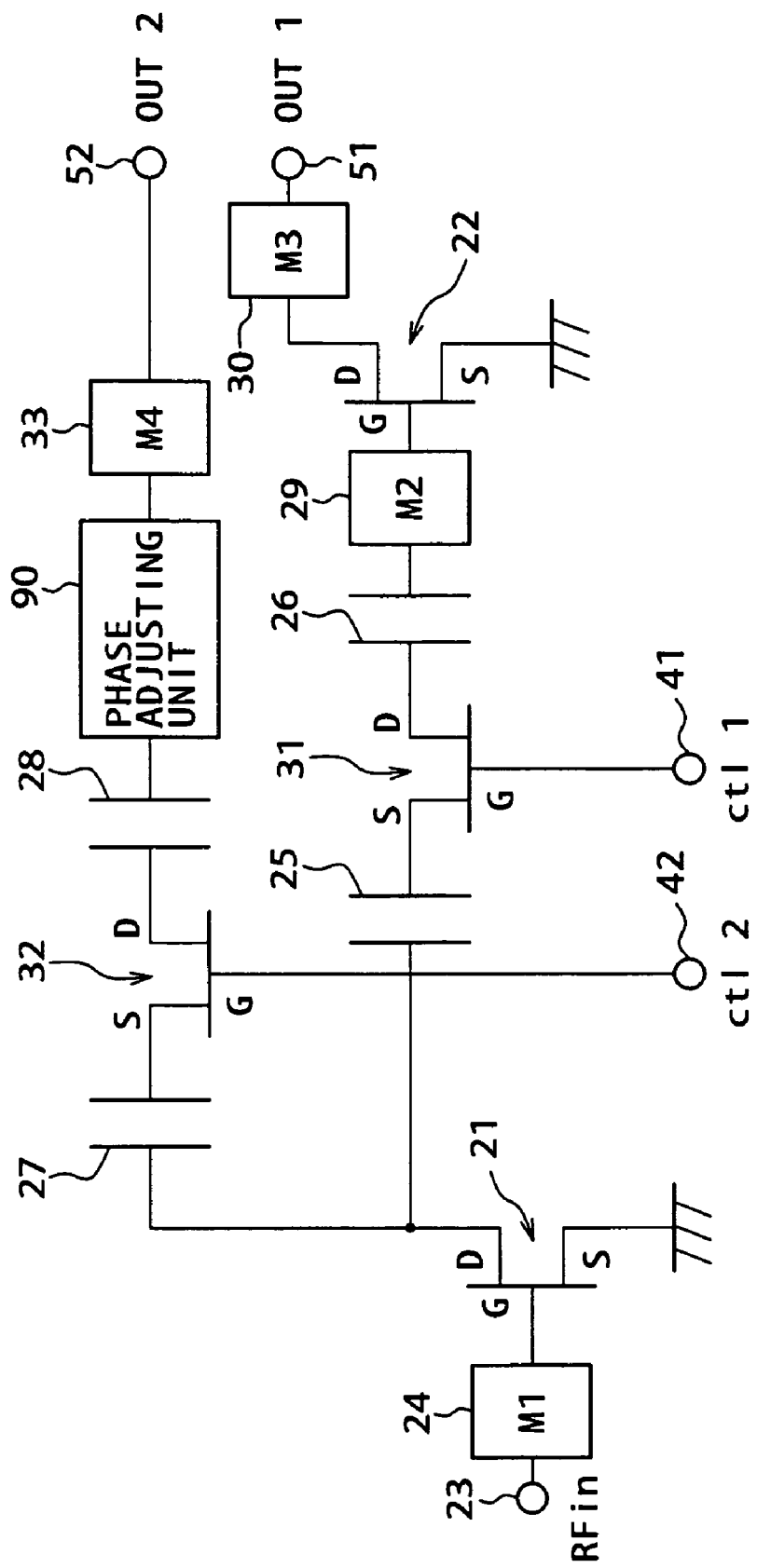
FIG. 5 is a circuitry diagram of a power amplification circuit provided in a transmission circuit in a mobile phone according to a third embodiment of the present invention.

In the mobile phone according to the third embodiment, as shown in FIG. 5, a phase adjusting circuit 90 is provided in the line connecting from the first amplification FET 21 to the second output terminal 52.

More specifically, the phase adjusting circuit 90 is inserted for connection between the DC-cut capacitor 28 which is connected to the drain of the second switching FET 32 and the fourth matching circuit 33 (M4).

By the way, in this example, although the phase adjusting circuit 90 will be described as provided on the side of the line connecting from the first amplification FET 21 to the second output terminal 52, it is not limited thereto, and it may be provided on the side of the line connecting from the first amplification FET 21 to the first output terminal 51 to the same effect.

Operation of the Third Embodiment

In the case of this power amplification circuit, when outputting a large power, a transmission signal is amplified in a total of two amplification FETs of the first amplification FET 21 and the second amplification FET 22. In contrast, when outputting a medium power, a transmission signal is amplified only in the first amplification FET 21 before its outputting. The transmission signal is rotated of its phase, for example, by 180 degrees through a single amplification FET.

Thereby, there results in a phase difference of 180 degrees between transmission signals of a high power output and a medium power output, therefore, the phase adjusting circuit 90 cancels this phase difference before outputting the transmission signal. That is, at the time of outputting a medium power, it rotates the phase of a transmission signal from the first amplification FET 21 by 180 degrees before outputting the same.

Effects and Advantages of the Third Embodiment

Thereby, it is enabled to output the transmission signals from the first output terminal 51 and the second output terminal 52 in the same phase, and in addition, the same effects and advantages according to the preceding embodiments are achievable.

Further, because the phase adjusting circuit 90 is provided in the line for use of outputting a medium power connecting between the first amplification FET 21 and the second output terminal 52, there results in no output loss in a transmission signal to be outputted from the line for use of outputting the high power (i.e., the line connecting between the first amplification FET 21 and the first output terminal 51), thereby enabling for a transmission signal amplified to a high power to be outputted as it is without a loss.

That is, when the phase adjusting circuit 90 is provided, there occurs a loss in its output more or less. Because it is preferable for the power which is amplified to a large power to be outputted as it is at the time of outputting the large power, in this example, the phase adjusting circuit 90 is installed in the line for use of outputting the medium power.

By way of example, if an output loss by the phase adjusting circuit 90 is within a permissible range, the phase adjusting circuit 90 may well be installed in the line for use of outputting the large power connecting between the first amplification FET 21 and the first output terminal 51 as described above.

Fourth Preferred Embodiment

A mobile phone according to a fourth preferred embodiment of the present invention will be described in the following. The mobile phone according to the fourth embodiment of the invention is provided with a selectable switch having a unique configuration specific to this mobile phone for selectively outputting, in response to a control signal from the control unit 5, either one of outputs from the line for use of outputting the medium power and the line for use of outputting the large power, which lines being provided in the power amplification circuit of the mobile phone according to any one of the embodiments describe above.

By the way, the fourth embodiment of the invention differs only in this respect from the preceding embodiments described above. Therefore, only this difference will be described in the following by omitting duplication.

Further, an example where the selectable switch of this embodiment is provided in the power amplification circuit within the mobile phone according to the first embodiment will be described in the following.

Constitution of the Fourth Embodiment

Figure 6:
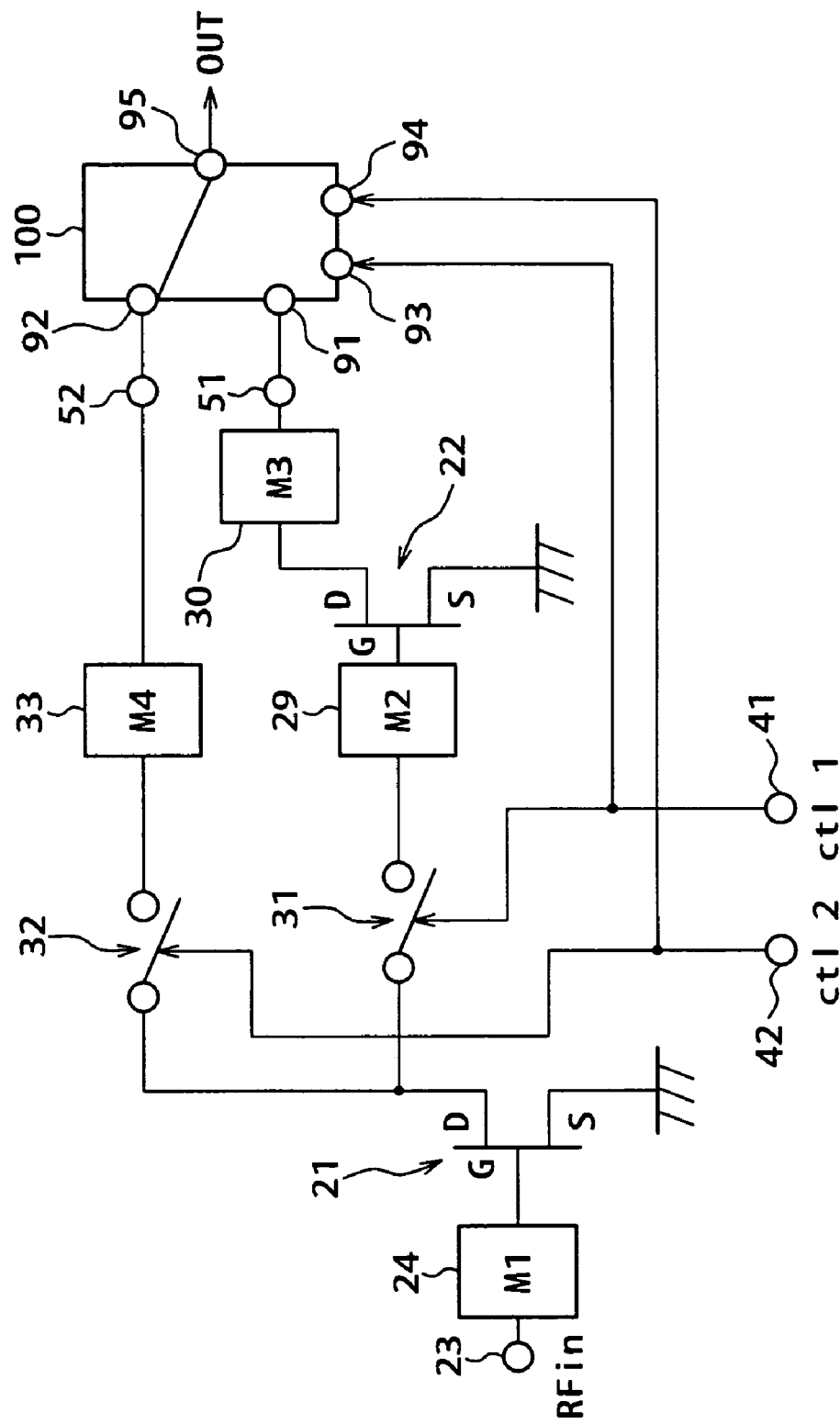
FIG. 6 is a circuitry diagram of a switchable power amplification circuit provided in a transmission circuit in a mobile phone according to a fourth embodiment of the present invention.

The mobile phone according to the fourth embodiment has a selection switch 100 for selectively outputting either one of the outputs from the line connecting between the first amplification FET 21 and the first output terminal 51 or the line connecting between the first amplification FET 21 and the second output terminal 52 provided in the power amplification circuit within the transmitter circuit 14, in response to a control signal supplied from the control unit 5 through a first control terminal 41 or a second control terminal 42, as shown in FIG. 6.

(Constitution of the Selection Switch)

Figure 7:
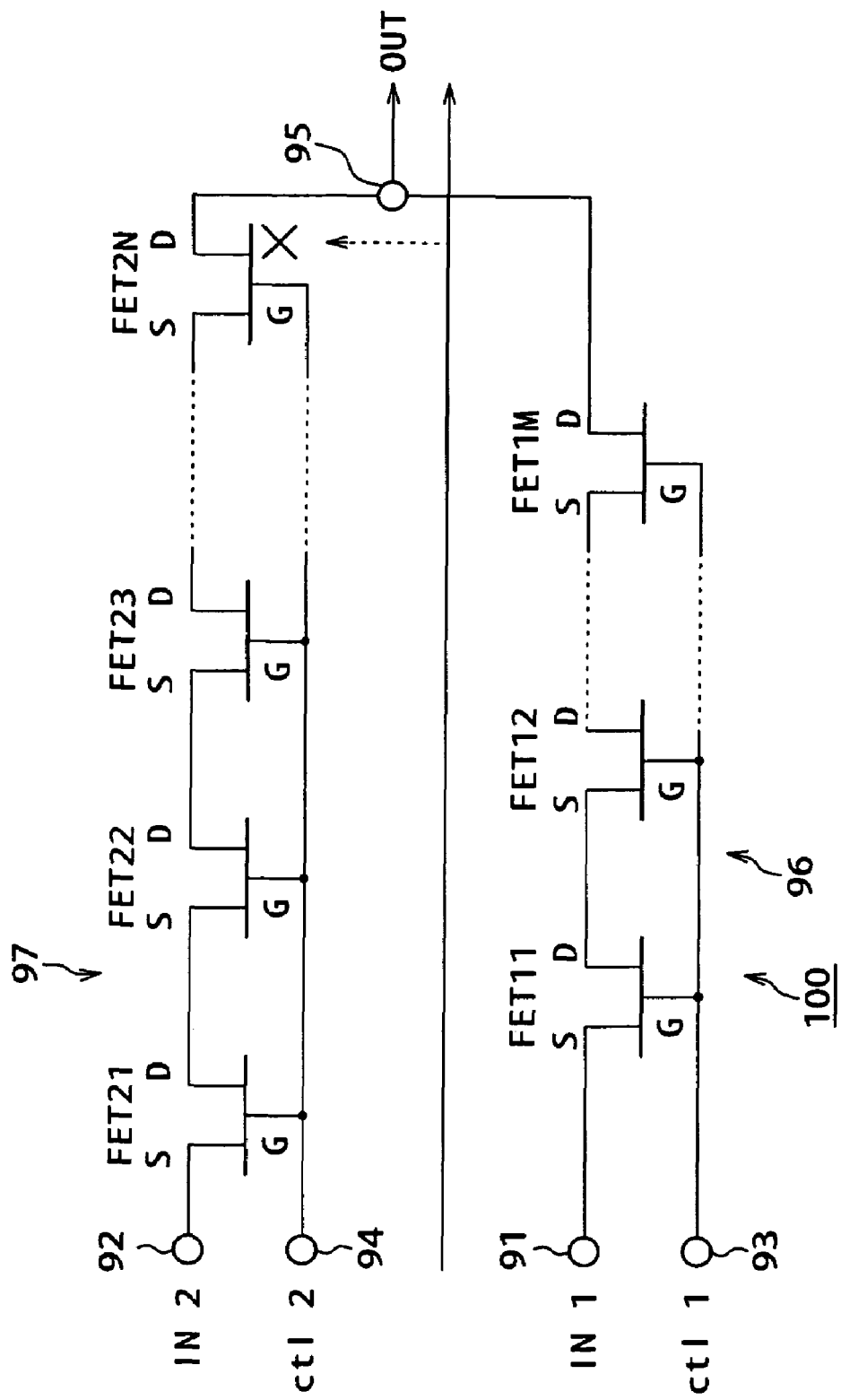
FIG. 7 is a circuitry diagram of a selection switch provided in the switchable power amplification circuit.

This selection switch 100 has a first branch switch block 96 including a plurality of FETs from the first to the Mth FETs (FET 11 to FET 1M, where M is a natural number equal to 2 or more) connected in series, and a second branch switch block 97 including a plurality of FETs from the, first to the Nth FETs (FET 11 to FET 1N, where N is a natural number equal to 3 or more) connected in series, as shown in FIG. 7.

The first branch switch block 96 has such a configuration that a drain of a preceding FET is connected to a source of a subsequent FET, e.g., a drain of the first FET 11 is connected to a source of the second FET 12 and a drain of the second FET 12 is connected to a source of the third FET 13, and so on.

Further, a source of the first FET 11 provided in the foremost stage in the first branch switch block 96 is connected to a first input terminal 91 to which a large power output amplified in the line from the first amplification FET 21 to the first output terminal 51 is supplied.

Still further, a drain of the Mth FET 1M provided in the rearmost stage in the first branch switch 96 is connected to an output terminal 95 of this selection switch 100.

And, respective gates of respective FET 11 to FET 1M that constitute the first branch switch block 96 are connected in common to a control terminal 93 (ctl 1) to which a same control signal as that supplied to the gate of the first switching FET 31 is supplied at the same timing.

The second branch switching block 97 is constructed likewise such that a drain of a preceding FET is connected to a source of a subsequent FET, e.g., a drain of the first FET 21 is connected to a source of the second FET 22, a drain of the second FET 22 is connected to a source of the third FET 23, and so on.

Further, a source of the first FET 21 provided in the foremost stage in the second branch switching block 97 is connected to a second input terminal 92 to which a medium power output which is amplified through the line connecting between the first amplification circuit FET 21 and the second output terminal 52 is supplied.

Still further, a drain of the Nth FET 2N provided in the rearmost stage in the second branch switching block 97 is connected to the output terminal 95 of the switch 100.

And, respective gates of respective FET 21 to FET 2N included in the second branch switch block 97 are connected in common to a control terminal 94 (ctl 2) to which-a same control signal as that to be supplied to the second switching FET 32 is supplied at the same timing.

Further, respective FETs that constitute respective branch switch blocks 96 and 97 (FET 11 to FET 1M, and FET 21 to FET 2N) are fabricated using the JP-HEMTs. As described above, when the respective FETs are formed using this JP-HEMT, they can be fabricated into a microstructure. Thereby, the power amplification circuit of the mobile phone according to the fourth embodiment is formed on one chip, including this selection switch 100.

By the way, in this example, each FET in the selection switch 100 will be described to be formed using the JP-HEMT, however, it is not limited thereto, and a HBT (hetero junction bipolar transistor) or a conventional HEMT may also be used as this FET. Even in this case, the same effects and advantages as will be described later can be obtained.

Here, as described hereinabove, because the first branch switch block 96 is supplied with a large power output which is amplified in the line from the first amplification FET 21 to the first output terminal 51, and the second branch switch block 97 is supplied with a medium power output which is amplified in the line from the first amplification FET 21 to the second output terminal 52, respective branch switch blocks 96 and 97 are constructed such that the number of FETs (M units) included in the first branch switch block 96 becomes smaller than the number of FETs (N units) included in the second branch switch block 97, i.e., M<N. That is, for example, if the first branch switch block 96 is constructed using two units of FETs, the second branch switch block 97 is constructed using three or more units of FETs. Accordingly, the numbers of FETs for constructing respective branch switch blocks 96 and 97 are arranged to become asymmetric therebetween.

(Operation of the Selection Switch)

Firstly, at the time of outputting a large power, a control signal, for example, of 2.7 V is supplied from the control unit 5 to the first control terminal 41 shown in FIG. 2, and a control signal of 0 V is supplied therefrom to the second control terminal 42. Thereby, the first switching FET 31 is turned ON and the second switching FET 32 is turned OFF, accordingly enabling to output a transmission signal which is amplified in multi stages in the first amplification FET 21 and the second amplification FET 22.

The control signal which is supplied to the first control terminal 41 is supplied at the same timing to respective gates of respective FETs 11 to 1M that constitute the first branch switch block 96 through the first control terminal 93 in the selection switch 100 shown in FIG. 7. Thereby, respective FETs 11 to 1M in the first branch switch block 96 are caused to turn ON.

Further, the control signal of 0 V which is supplied to the second control terminal 42 is supplied at the same timing to respective gates of respective FETs 21 to 2N that constitute the second branch switch block 97 through the second control terminal 94 in the selection switch 100 shown in FIG. 7. Thereby, respective FETs 21 to 2N that constitute the second switch block 97 are caused to turn OFF.

Then, the transmission signal which is amplified in multi stages of the first amplification FET 21 and the second amplification FET 22, and supplied to the selection switch 100 through a first input terminal 91 is supplied by sequentially passing through respective FETs 11 to 1M in the first branch switch block 96 to the output terminal 95.

Next, at the time when outputting a medium power, a control signal, for example, of 0V is supplied from the control unit 5 to the first control terminal 41 shown in FIG. 2, and a control signal, for example, of 2.7 V is supplied therefrom to the second control terminal 42. Thereby, the first switching FET 31 is turned OFF and the second switching FET 32 is turned ON, accordingly enabling to output a transmission signal which is amplified only in the first amplification FET 21.

The control signal of 0V supplied to the first control terminal 41 is supplied at the same timing to respective gates of respective FETs 11 to 1M that constitute the first branch switch block 96 through the control terminal 93 in the selection switch shown in FIG. 7. Thereby, the respective FETs 11 to 1M in the first branch switch block 96 are caused to turn OFF.

Further, the control signal of 2.7 V which is supplied to the second control terminal 42 is supplied at the same timing to respective gates of respective FETs 21 to 2N that constitute the second branch switch block 97 through a control terminal 94 in the selection switch 100 shown in FIG. 7. Thereby, the respective FETs 21 to 2N in the second branch switch block 97 are caused to turn ON.

Then, the transmission signal which is amplified only in the first amplification FET 21, and supplied to the selection switch 100 through a second input terminal 92 is supplied sequentially by passing through respective FETs 21-2N in the second branch switch block 97 to the output terminal 95.

It is to be noted here that in the selection switch 100, the number of FETs in the first branch switch 96 to which a large power transmission signal is supplied is smaller than the number of FETs in the second branch switch block 97 to which a medium power transmission signal is supplied. The greater the number of FETs that constitute the branch switch block becomes, the more increases its insertion loss, and also the greater its isolation becomes.

Therefore, the first branch switch block 96, because it has a smaller number of FETs than that in the second branch switch block 97, is enabled to have a lower insertion loss and to output the large power transmission signal without causing a loss from the output terminal 95.

Further, because the number of FETs in the second branch switch block 97 is larger than the number of FETs in the first branch switch block 96, isolation of the second branch switch block 97 becomes higher than isolation of the first branch switch block 96.

Thereby, such a problem that the large power transmission signal passing through the first branch switch block 96 diverges (intrudes) into the second branch switch block 97 as shown by an arrow of dotted lines in FIG. 7 can be prevented, thereby securing for the large power transmission signal efficiently to be outputted from the output terminal 95 without causing a loss due to this divergence as shown by an arrow of a solid line in FIG. 7.

In other words, respective numbers of FETs that constitute respective branch switch blocks 96 and 97 are adjusted to become asymmetric as described above so that the second branch switch block 97 is ensured to have an adequate isolation required at the time of outputting the large power.

Effects and Advantages of the Fourth Embodiment

As obvious from the description heretofore, in the mobile phone according to the fourth embodiment, it is arranged so that the number of FETs which constitute the first branch switch block 96 to which the large power transmission signal is supplied becomes smaller than the number of FETs which constitute the second branch switch block 97 to which the medium power transmission signal is supplied, thereby enabling to reduce the loss of insertion thereof in the first branch switch block 96, and in addition, to increase the isolation of the second branch switch block 97.

Thereby, the large power transmission signal is enabled to be outputted without causing a loss therein. Further, such the problem that the large power transmission signal from the first branch switch block 96 invades the second branch switch block 97 can be prevented. Thereby, the large power transmission signal can be outputted while as approximately maintaining its level of the high power, and in addition, the same effect and advantages as those according to any of the preceding embodiments described above can be obtained.

Fifth Preferred Embodiment

A mobile phone according to a fifth preferred embodiment of the present invention will be described in the following. The mobile phone according to the fifth embodiment features an isolation increment circuit added to respective branch switch blocks 96 and 97 in the selection switch 100 in the mobile phone according to the fourth embodiment described above.

By the way, the fourth embodiment and the fifth embodiment differ only in this respect. Therefore, only this difference will be described in the following, omitting duplication of the description.

Constitution of the Fifth Embodiment

Figure 8:
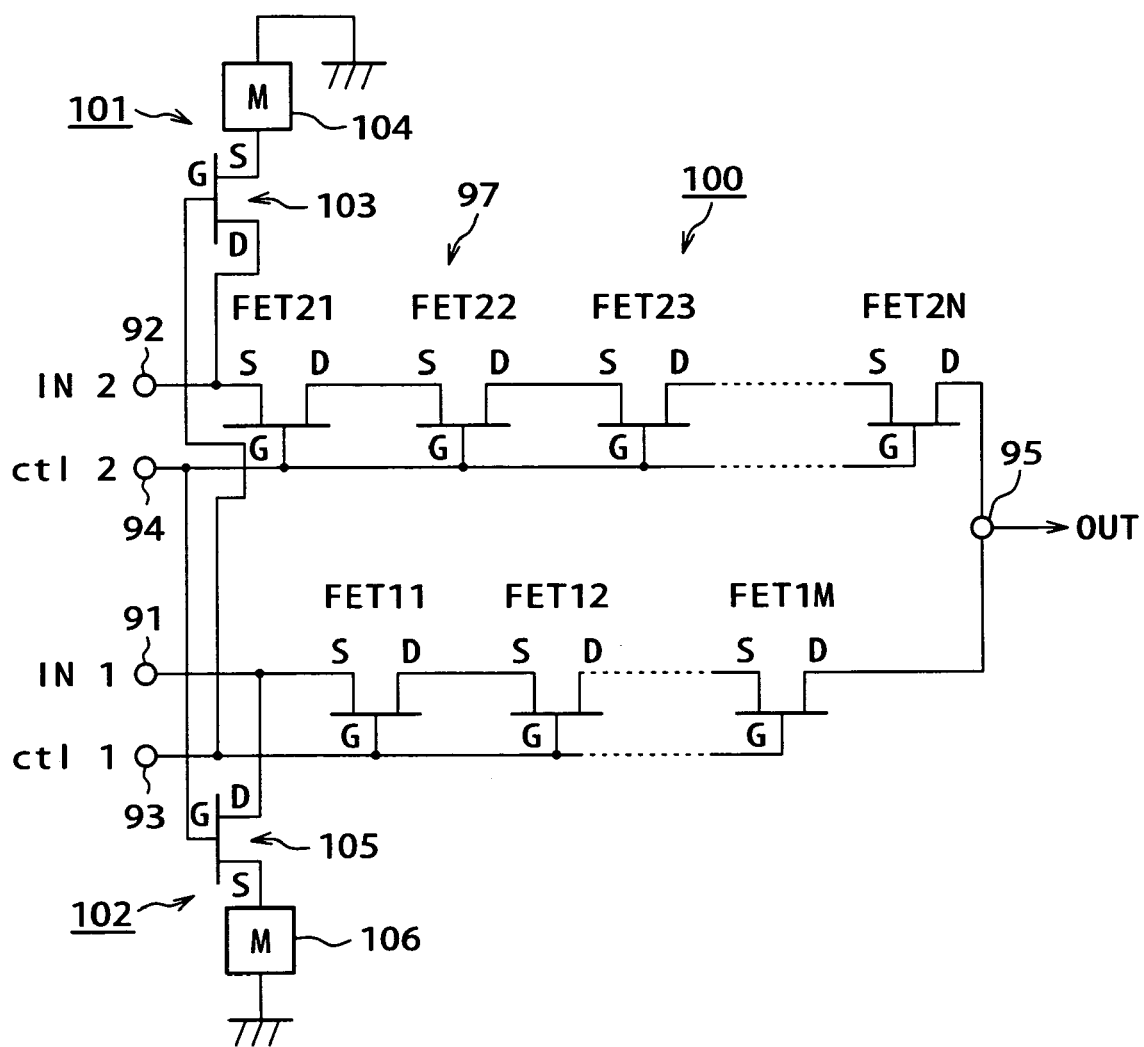
FIG. 8 is a circuitry diagram of a selection switch provided in a transmission circuit in a mobile phone according to a fifth embodiment of the present invention.

The mobile phone according to the fifth embodiment has a first and a second isolation increment circuit 101 and 102 connected respectively to a branch switch block 101 and 102 as shown in FIG. 8.

More specifically, the first isolation increment circuit 101 has an FET 103 and a matching circuit 104. A gate of the FET 103 is connected to the first control terminal 93, and a drain thereof is connected to the second input terminal 92 to which the medium power transmission signal is supplied. Further, a source of this FET 103 is grounded through the matching circuit 104.

Likewise, the second isolation increment circuit 102 has an FET 105 and a matching circuit 106. A gate of the FET 105 is connected to the second control terminal 94, and a drain thereof is connected to the first input terminal 91 to which the large power transmission signal is supplied. Further, a source of this FET 105 is grounded through the matching circuit 106.

Operation and Effect of the Fifth Embodiment

In this selection switch 100, when outputting a large power, the FET 103 is turned ON by the control signal of 2.7 V supplied to the first control terminal 93 to activate the first isolation increment circuit 101. Thereby, the isolation of the second branch switch block 97 can be further increased. Therefore, the problem that the large power output from the first branch switch block 96 invades the second branch switch block 97 is more powerfully prevented, thereby enabling for the large power transmission signal to be outputted more preferably.

Further, when outputting a medium power, the FET 105 is turned ON by the control signal of 2.7 V supplied to the second control terminal 94 to activate the second isolation increment circuit 102.

As described hereinabove, the isolation of the first branch switch block 96 is lower than the isolation of the second branch switch block 97 because that the number of FETs included in the first branch switch block 96 is smaller than the number of FETs included in the second branch switch block 97, however, by activation of this second isolation increment circuit 102, a problem that the medium power output from the second branch switch block 97 invades the first branch switch block 96 can be prevented. Thereby, it is also enabled for the medium power transmission signal to be outputted efficiently.

In addition, the mobile phone according to the fifth embodiment can achieve the same effects and advantages as the mobile phones according to any of the preceding embodiments described above.

Sixth Preferred Embodiment

A mobile phone according to a sixth embodiment of the present invention will be described in the following. The mobile phone according to the sixth embodiment features in that the respective FETs which constitute the first branch switch block 96 within the selection switch 100 in the mobile phone according to the fifth embodiment are disposed in a parallel connection.

By the way, the above fifth embodiment and this sixth embodiment differ only in this respect. Therefore, only this difference will be described in the following by omitting duplication in description.

Constitution of the Sixth Embodiment

Figure 9:
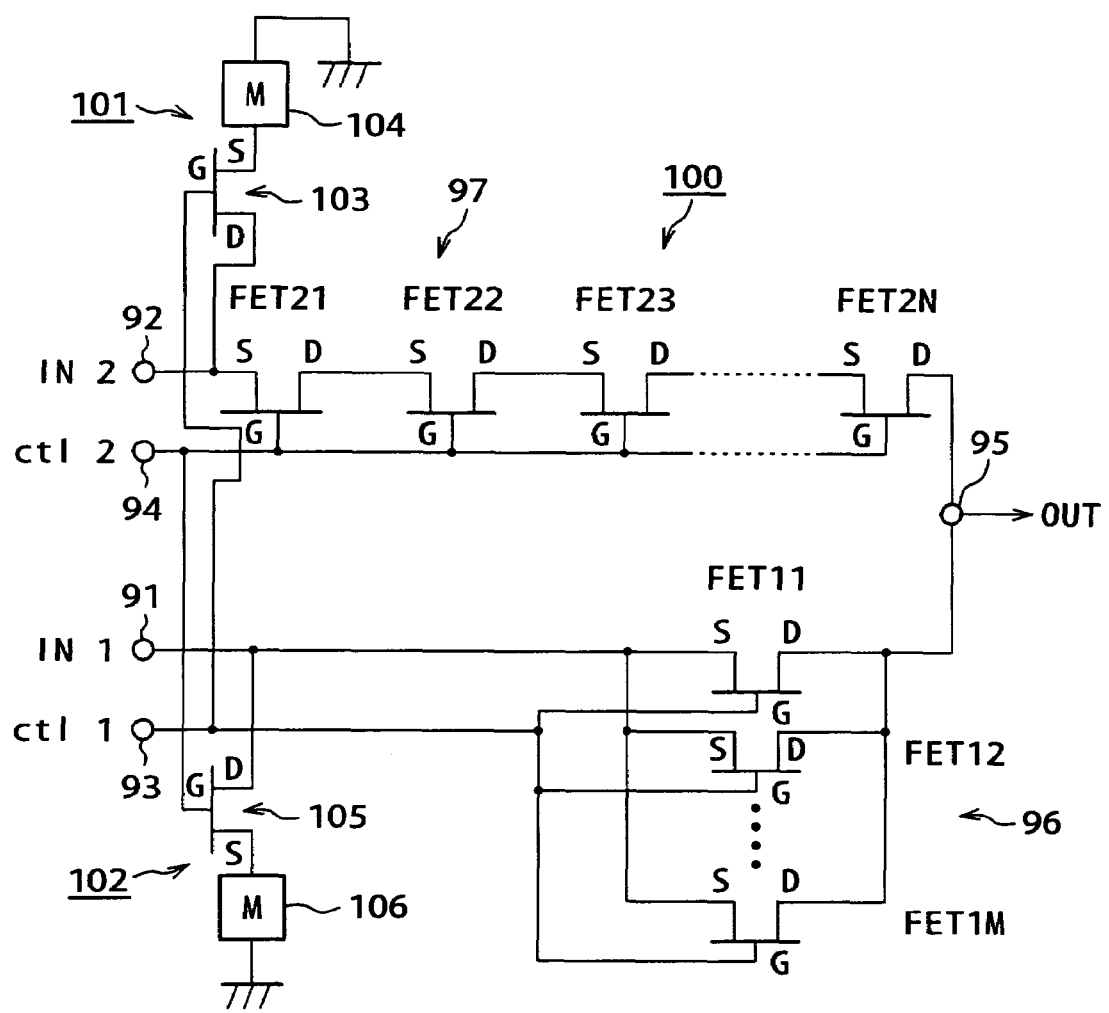
FIG. 9 is a circuitry diagram of a selection switch provided in a transmission circuit in a mobile phone according to a sixth embodiment of the present invention.

With reference to FIG. 9, in the mobile phone according to the sixth embodiment, respective sources of respective FET 11 to FET 1M that constitute the first branch switch block 96 are connected in common to the first input terminal 91, and respective drains of respective FET 11 to FET 1M are connected in common to the output terminal 95. Further, respective gates of the respective FET 11 to 1M are connected in common to the gate of FET 103 of the first isolation increment circuit 101.

Operation and Effect of the Sixth Embodiment

According to this selection switch 100, at the time when outputting a large power, in response to a control signal of 2.7 V supplied through the first control terminal 93, respective FET 11 to FET 1M in the first branch switch block 96 are turned ON, and a large power transmission signal supplied through the first input terminal 91 is outputted from the output terminal 95 through respective FET 11 to FET 1M.

Further, in response to the control signal of 2.7 V supplied through the first control terminal 93, the first isolation increment circuit 101 is turned ON to adjust the isolation of the second branch switch block 97 to be increased.

Thereby, in addition to the same effect achieved in the mobile phone according to the fifth embodiment, the same effects and advantages achieved by the first to the fourth embodiments described above can be obtained.

Seventh Preferred Embodiment

In the next, a mobile phone according to a seventh embodiment of the present invention will be described. The mobile phone according to the seventh embodiment features an oscillation prevention circuit added to the selection switch 100 within the mobile phone according to the fourth embodiment described above.

By the way, the fourth embodiment described above and this seventh embodiment differ only in this respect. Therefore, only this difference will be described, omitting duplication of description.

Constitution of the Seventh Embodiment

Figure 10:
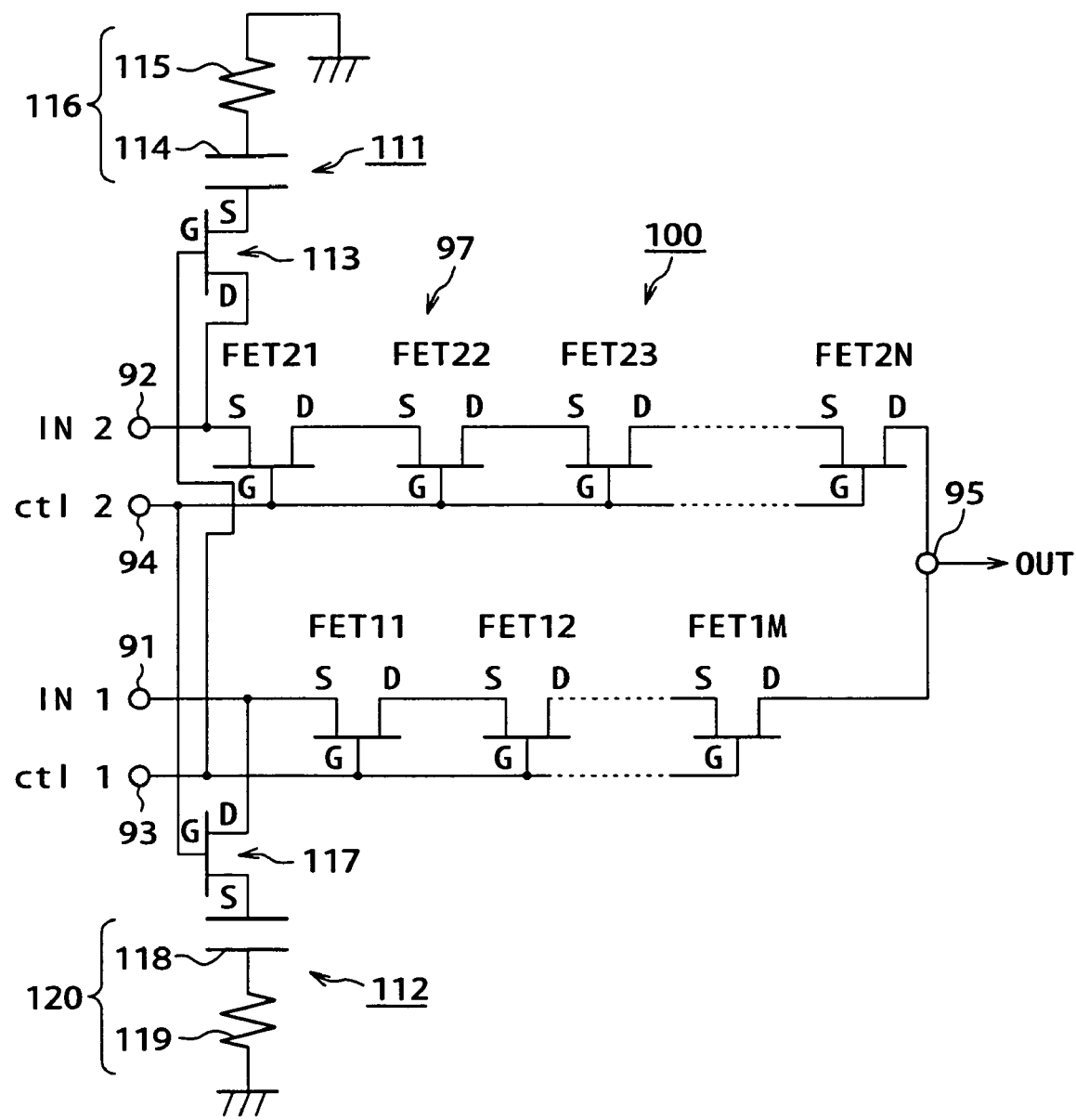
FIG. 10 is a circuitry diagram of a selection switch provided in a transmission circuit in a mobile phone according to a seventh embodiment of the present invention.

The mobile phone according to the seventh embodiment has a first and second oscillation prevention circuits 111 and 112 added to the selection switch 100 as shown in FIG. 10.

The first oscillation prevention circuit 111 has an FET 113 and a termination matching circuit 116 that is composed by connecting in series a capacitor 114 and a resistor 115, for example, of 50 Ω. A gate of the FET 113 is connected to the first control terminal 93, a drain thereof is connected to the second input terminal 92, and a source thereof is grounded through the termination matching circuit 116.

Likewise, the second oscillation prevention circuit 112 has an FET 117 and a termination matching circuit 120 which is composed by connecting in series a capacitor 118 and a resistor 119, for example, of 50 Ω. A gate of FET 117 is connected to the second control terminal 94, a drain thereof is connected to the first input terminal 91, and a source thereof is grounded through the termination matching circuit 120.

Operation of the Seventh Embodiment

As described hereinabove, according to this selection switch 100, at the time when outputting a large power, by supplying a control signal of 2.7 V to the first branch switch block 96, a large power transmission signal supplied through the first input terminal 91 is selectively outputted, and at the time when outputting a medium power, by supplying a control signal of 2.7 V to the second branch switch block 97, a medium power transmission signal supplied through the second input terminal 92 is selectively outputted. However, when such a switching operation to switch between these outputs is carried out, there may occur an oscillation at the time of switching because of an instantaneous opening of the outputs.

That is, the operations of the selection switch 100 and the power amplification circuit provided in the preceding stage thereof (any power amplification circuit described above with respect to the first embodiment to the fourth embodiment) are controlled by the control signal at the same timing. Thereby, the control operation to turn OFF either one of the lines not in use in this power amplification circuit and the switching operation of the selection switch 100 are assumed to be operated almost simultaneously, however, even if a control signal is supplied at the same timing both to the power amplification circuit and the selection switch 100, a speed of switching operation of the selection switch 100 becomes actually faster than a speed of controlling the line not in use in the power amplification circuit to be turned OFF. Thereby, at the time of switching operation by the selection switch 100, oscillation may occur because of an instantaneous opening of the output.

Thereby, in this selection switch 100, at the time when outputting a large power, by a control signal of 2.7 V supplied to the first control terminal 93, the FET 113 is turned ON to activate the first oscillation prevention circuit 111. Thereby, a medium power transmission signal being supplied through the second input terminal 92 is enabled to be terminated in the termination matching circuit 116, accordingly preventing the oscillation.

Likewise, in this selection switch 100, at the time of outputting a medium power, by a control signal of 2.7 V supplied to the second control terminal 94, the FET 117 is turned ON to activate the second oscillation prevention circuit 112. Thereby, a large power transmission signal being supplied through the first input terminal 91 is enabled to be terminated in the termination matching circuit 120, thereby preventing the occurrence of oscillation.

Effect of the Seventh Embodiment

As obvious from the description hereinabove, in the mobile phone according to the seventh embodiment, an oscillation prevention circuit is provided in the branch switch blocks 96 and 97, respectively, and at the time of outputting a large power, a medium power output from the second branch switch block 97 is terminated therein, then at the time of outputting a medium power, a large power output from the first branch switch block 96 is terminated therein.

Thereby, the occurrence of oscillation at the time of switching operation by the selection switch 100 can be prevented, and in addition, the same effects as the mobile phones according to the respective embodiments described above can be obtained.

In the hereinabove descriptions of respective embodiments, the mobile phone of the present invention has been set forth as applicable to the mobile phone of the W-CDMA method, however, it is not limited thereto, and it can be applied also to a mobile phone based on other methods such as the PDC method and the like, or to a communication terminal apparatus.

Further, in the above description of respective embodiments, although the present invention has been described as applied to the selection switch for switching between the plural outputs from the power amplification circuit, it is not limited thereto, and it can be applied to any other switching circuit for switching between its outputs, for example, an antenna switch circuit and the like as well.

In the last, the present invention is not limited to the exemplary embodiments disclosed hereinabove. Therefore, it should be understood that many changes, variations and combinations are possible in the design and the like thereof without departing from the scope of the present invention.

What is claimed is:

1. A switch apparatus comprising:
   a first input terminal to which a first input signal is supplied;
   a second input terminal to which a second input signal having a level lower than a level of the first input signal is supplied;
   a first switch block configured to output the first input signal supplied from the first input terminal through a plurality of switching elements;
   a second switch block configured to output the second input signal supplied from the second input terminal through a plurality of switching elements; and
   a control terminal to which a control signal is supplied wherein the control signal controls the first switch block when outputting the first input signal, and controls the second switch block when outputting the second input signal, wherein
   the first switch block is configured to have a smaller number of switching elements than that of the second switch block.

2. The switch apparatus as cited in claim 1, further comprising:
   a first isolation enhancing circuit connected to the first switch block configured to enhance an isolation of the first switch block by activating when the second switch block is controlled by the control signal; and
   a second isolation enhancing circuit connected to the second switch block configured to enhance an isolation of the second switch block by activating when the first switch block is controlled by the control signal.

3. The switch apparatus as cited in claim 1, further comprising:
   a first termination circuit connected to the first switch block configured to terminate the first switch block by activating when the second switch block is controlled by the control signal; and
   a second termination circuit connected to the second switch block configured to terminate the second switch block by activating when the first switch block is controlled by the control signal.

4. A switch apparatus comprising:
   a first switch block in which a drain of a first FET, where a source of the first FET is connected to a first input terminal, is connected to a source of a second FET, a drain of the second FET is connected to a source of a third FET, a drain of a similarly connected Mth FET (M is a natural number) is connected to an output, and all gates of FETs of the first switch block are set to be a first control terminal by mutually connecting; and
   a second switch block in which a drain of a fourth FET, where a source of the fourth FET is connected to a second input terminal, is connected to a source of a fifth FET, a drain of the fifth FET is connected to a source of a sixth FET, a drain of a similarly connected Nth FET (N is a natural number) is connected to the output, and all gates of the FETs of the second switch block are set to be a second control terminal by mutually connecting, wherein
   a relation between the number M of the FETs included in the first switch block and the number N of the FETs included in the second switch block is set to be M<N.

5. The switch apparatus as cited in claim 4, further comprising:
   a seventh FET in which a gate is connected to the second control terminal, a drain is connected to the first input terminal, and a source is connected to ground;
   a first matching circuit connected between the source of the seventh FET and ground;
   an eighth FET in which a gate is connected to the first control terminal, a drain is connected to the second input terminal, and a source is connected to ground; and
   a second matching circuit connected between the source of the eighth FET and ground.

6. The switch apparatus as cited in claim 5, wherein
   the first matching circuit is a termination matching circuit of the first switch block, and
   the second matching circuit is a termination matching circuit of the second switch block.

7. A switch apparatus comprising:
   a first switch block in which all sources of M FETs (where M is a natural number) are connected to be a first input terminal, all drains of the M FETs are connected to be an output terminal, and all gates of the M FETs are connected to be a first control terminal; and
   a second switch block in which a drain of a first FET, where a source of the first FET is connected to a second input terminal is connected to a source of a second FET, a drain of the second FET is connected to a source of a third FET, a drain of a similarly connected Nth FET (N is a natural number) is connected to the output terminal, and all gates of the FETs are set to be a second control terminal by mutually connecting, wherein
   a relation between the number M of the FETs included in the first switch block and the number N of the FETs included in the second switch block is set to be M<N.

8. A switchable power amplifier apparatus comprising:
   a first amplifier element configured to amplify an input signal;
   a second amplifier element configured to further amplify the input signal amplified in the first amplifier element and supply the input signal to a first output terminal;
   a first switch element configured to perform an on/off operation based on a control signal for setting the second amplifier element in an operating condition by supplying the input signal from the first amplifier element when performing an on operation, and configured to set the second amplifier element in a non-operating condition by not supplying the input signal from the first amplifier element when performing an off operation;
   a second switch element configured to perform an on/off operation based on a control signal, but opposite to the operation of the first switch element, to supply the input signal from the first amplifier element to a second output terminal when performing an on operation, and to stop the supply of the input signal to the second output terminal when performing an off operation;
   a first switch block configured to perform an on operation based on the control signal for setting the first switch element in an on operation and to output through a plurality of switch elements a first input signal supplied through the first output terminal; and a second switch block configured to perform an on operation based on the control signal for setting the second switch element in an on operation and to output through a second plurality of switch elements a second input signal, a level of which is lower than that of the first input signal, supplied through the second output terminal, wherein a number of switch elements included in the second switch block is larger than a number of switch elements included in the first switch block.

9. The switchable power amplifier apparatus as cited in claim 8, wherein the first amplifier element includes a FET in which a source is connected to ground, and an output having a level amplified in response to the input signal supplied to a gate of the FET is derived from a drain of the FET, and further comprising:

a power adjustment circuit configured to superpose a power adjustment signal, having a level larger than that of when the control signal sets the second amplifier element into an operating condition, onto the input signal supplied to the gate of the first amplifier element when the control signal for setting the second amplifier element into a non-operating condition is supplied to the first switch element.

10. The switchable power amplifier apparatus as cited in claim 8 or claim 9, further comprising:

a phase adjustment circuit configured to adjust the input signal so that a phase of the input signal amplified by the first amplifier element and the second amplifier element and supplied to the first output terminal, and the input signal amplified only by the first amplifier element and supplied to the second output terminal become the same phase.

11. The switchable power amplifier apparatus as cited in claim 8 or claim 9, further comprising:

a first isolation enhancing circuit connected to the first switch block configured to enhance an isolation of the first switch block by activating when the second switch block is controlled by the control signal; and a second isolation enhancing circuit connected to the second switch block configured to enhance an isolation of the second switch block by activating when the first switch block is controlled by the control signal.

12. The switchable power amplifier apparatus as cited in claim 8 or claim 9, further comprising:

a first termination circuit connected to the first switch block configured to terminate the first switch block by activating when the second switch block is controlled by the control signal; and a second termination circuit connected to the second switch block configured to terminate the second switch block by activating when the first switch block is controlled by the control signal.

13. The switchable power amplifier apparatus as cited in claim 8 or claim 9, including the first amplifier element, the second amplifier element, the first switch element, the second switch element, the first switch block, and the second switch block configured to be formed on one chip based on a high mobility electron transistor formed by:

a high mobility electron channel formed near a heterojunction between two semiconductor layers of a plurality of semiconductor layers stacked on a semiconductor substrate forming a channel of the high mobility electron transistor;

a contact semiconductor layer, which is made of impurity doped semiconductor material, formed on at least one side surface of the plurality of the semiconductor layers; and a source electrode or a drain electrode formed through an ohmic contact layer on the contact semiconductor layer.

14. A mobile communication terminal apparatus which converts a transmission output of a transmission signal to a plurality of transmission outputs by a power amplifier circuit, and transmits one of the transmission outputs by selecting a selection switch, wherein the power amplifier circuit comprises:

a first amplifier element configured to amplify the transmission signal, a second amplifier element configured to further amplify the transmission signal amplified in the first amplifier element and supply the transmission signal to a first output terminal, a first switch element performing an on/off operation based on a control signal configured to set the second amplifier element in an operating condition by supplying the transmission signal from the first amplifier element when performing on operation, and setting the second amplifier element in a non-operating condition by not supplying the transmission signal from the first amplifier element when performing an off operation, and second switch element configured to perform an on/off operation based on a control signal, but opposite to the operation of the first switch element, to supply the transmission signal from the first amplifier element to a second output terminal when performing an on operation, and to stop the supply of the transmission signal to the second output terminal when performing an off operation; and said selection switch comprises:

a first switch block configured to perform an on operation based on the control signal for setting the first switch element in performing an on operation and to output through a plurality of switch elements a first transmission signal supplied through the first output terminal, and a second switch block configured to perform an on operation based on the control signal for setting the second switch element in performing an on operation and to output through a second plurality of switch elements a second transmission signal, a level of which is lower than that of the first transmission signal, supplied through the first output terminal, wherein a number of switch elements included in the second switch block is larger than a number of switch elements included in the first switch block.

15. The mobile communication terminal apparatus as cited in claim 14, wherein the first amplifier element includes a FET in which a source is connected to ground, and an output having a level amplified in response to the input signal supplied to a gate is derived from a drain, and further comprising:

a power adjustment circuit configured to superpose a power adjustment signal, having a level larger than that of when the control signal sets the second amplifier element into operating condition, onto the input signal supplied to the gate of the first amplifier element when the control signal for setting the second amplifier element into non-operating condition is supplied to the first switch element.

16. The mobile communication terminal apparatus as cited in claim 14 or claim 15, further comprising:
   a phase adjustment circuit configured to adjust the input signal so that a phase of the input signal amplified by the first amplifier element and the second amplifier element and supplied to the first output terminal, and the input signal amplified only by the first amplifier element and supplied to the second output terminal become the same phase.

17. The mobile communication terminal apparatus as cited in claim 14 or claim 15, further comprising:
   a first isolation enhancing circuit connected to the first switch block configured to enhance an isolation of the first switch block by activating when the second switch block is controlled by the control signal; and
   a second isolation enhancing circuit connected to the second switch block configured to enhance an isolation of the second switch block by activating when the first switch block is controlled by the control signal.

18. The mobile communication terminal apparatus as cited in claim 14 or claim 15, further comprising:
   a first termination circuit connected to the first switch block configured to terminate the first switch block by activating when the second switch block is controlled by the control signal; and
   a second termination circuit connected to the second switch block configured to terminate the second switch block by activating when the first switch block is controlled by the control signal.

19. The mobile communication terminal apparatus as cited in claim 14 or claim 15 including the first amplifier element, the second amplifier element, the first switch element, the second switch element, the first switch block, and the second switch block configured to be formed on one chip having the power amplifier circuit and the selection circuit formed based on a high mobility electron transistor formed by:
   a high mobility electron channel formed near a heterojunction between two semiconductor layers of a plurality of semiconductor layers stacked on a semiconductor substrate for forming a channel of a transistor;
   a contact semiconductor layer, which is made of impurity doped semiconductor material, formed on at least one side surface of the plurality of the semiconductor layers; and
   a source electrode or a drain electrode formed through an ohmic contact layer on the contact semiconductor layer.

* * * * *